(12) United States Patent
Kimura et al.

(10) Patent No.: US 11,914,439 B2
(45) Date of Patent: Feb. 27, 2024

(54) SYNCHRONOUS RESET SIGNAL GENERATION CIRCUIT AND DIGITAL PROCESSING DEVICE

(71) Applicant: Rohm Co., Ltd., Kyoto (JP)

(72) Inventors: Hiromitsu Kimura, Kyoto (JP); Yuji Kurotsuchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 323 days.

(21) Appl. No.: 17/600,702

(22) PCT Filed: Mar. 17, 2020

(86) PCT No.: PCT/JP2020/011758
§ 371 (c)(1),
(2) Date: Oct. 1, 2021

(87) PCT Pub. No.: WO2020/213334
PCT Pub. Date: Oct. 22, 2020

(65) Prior Publication Data
US 2022/0187887 A1 Jun. 16, 2022

(30) Foreign Application Priority Data

Apr. 17, 2019 (JP) .................................. 2019078607

(51) Int. Cl.
*H03K 17/22* (2006.01)
*G06F 1/24* (2006.01)
*H03K 21/10* (2006.01)

(52) U.S. Cl.
CPC ............... *G06F 1/24* (2013.01); *H03K 21/10* (2013.01)

(58) Field of Classification Search
CPC .................................. G06F 1/24; H03K 21/10
See application file for complete search history.

(56) References Cited

U.S. PATENT DOCUMENTS 4,317,200 A * 2/1982 Wakatsuki ..... G01R 31/318536
714/743
7,400,179 B2 * 7/2008 Lin ...................... H03K 17/223
327/143

(Continued)

FOREIGN PATENT DOCUMENTS

| CN | 105103160 | 11/2015 |
|----|-----------|---------|
| JP | H10163821 | 6/1998 |

(Continued)

OTHER PUBLICATIONS

International Search Report and Written Opinion in International Appln. No. PCT/JP2020/011758, dated Jun. 16, 2020, 4 pages (with English Translation).

*Primary Examiner* — Kurtis R Bahr
(74) *Attorney, Agent, or Firm* — Fish & Richardson P.C.

(57) ABSTRACT

A synchronous reset signal is generated from an asynchronous reset signal. The synchronous reset signal is output from the final-stage FF among L FFs connected in a cascade arrangement. A first error determination signal is output from the final-stage FF among M FFs connected in a cascade arrangement. Among N FFs connected in a cascade arrangement, the initial-stage FF receives the first error determination signal, and the final-stage FF outputs a second error determination signal. Based on the three outputs, the presence or absence of a fault in the circuit is determined. L, M, and N fulfil M≥2, L≥M+1, and M+N≥L+1.

12 Claims, 8 Drawing Sheets

(56) References Cited

U.S. PATENT DOCUMENTS

| | | | | |
|---|---|---|---|---|
| 8,819,401 | B2 * | 8/2014 | Shimizu | G06F 1/24 |
| | | | | 713/1 |
| 8,912,829 | B1 * | 12/2014 | Ogden | G06F 1/24 |
| | | | | 327/143 |
| 11,271,550 | B1 * | 3/2022 | Kossel | H03K 23/588 |
| 2014/0281643 | A1 | 9/2014 | Tiri et al. | |

FOREIGN PATENT DOCUMENTS

| | | |
|---|---|---|
| JP | 2000261310 | 9/2000 |
| JP | 2009080634 | 4/2009 |
| JP | 2010094270 | 4/2010 |
| JP | 2011176411 | 9/2011 |
| JP | 2016514332 | 5/2016 |
| KR | 20150128834 | 11/2015 |
| WO | WO 2014164512 | 10/2014 |

\* cited by examiner

SYNCHRONOUS RESET SIGNAL GENERATION CIRCUIT AND DIGITAL PROCESSING DEVICE

TECHNICAL FIELD

The present disclosure relates to a synchronous reset signal generation circuit and to a digital processing device.

BACKGROUND ART

Synchronous reset signal generation circuits are an important circuit that generates a synchronous reset signal needed for stable initialization of a logic circuit, and are used widely from in CPU platforms to in simple sequencers.

FIG. 12 shows a common synchronous reset signal generation circuit 901. The synchronous reset signal generation circuit 901 is composed of a plurality of flip-flops connected in a cascade arrangement, and those flip-flops are commonly fed with a clock signal CLK' and an asynchronous reset signal RSTN'. The synchronous reset signal generation circuit 901 synchronizes the asynchronous reset signal RSTN' with the clock signal CLK' and thereby generates a synchronous reset signal $S_{RSTN}'$, which is a reset signal synchronous with the clock signal CLK'.

CITATION LIST

Patent Literature

Patent Document 1: Japanese unexamined patent application publication No. H10-163821
Patent Document 2: Japanese unexamined patent application publication No. 2009-80634

SUMMARY

Technical Problem

A fault in a synchronous reset signal generation circuit causes resetting failure, and this increases the risk of serious trouble in an entire system that incorporates a logic circuit. Thus desired is a technology that enables satisfactory determination and detection of faults of that kind. Such a technology would be of great significance in systems that are required to be highly reliable, such as in vehicle-mounted equipment and industrial equipment (and can be useful in any system).

An object of the present disclosure is to provide a synchronous reset signal generation circuit and a digital processing device that can satisfactorily determine and detect the presence or absence of a fault related to the resetting of synchronization.

Solution to Problem

According to one aspect of the present disclosure, a synchronous reset signal generation circuit configured to generate a synchronous reset signal by synchronizing an asynchronous reset signal with a clock signal includes: a synchronous reset signal output circuit having L flip-flops connected in a cascade arrangement and configured to output the synchronous reset signal from the final-stage flip-flop among the L flip-flops; a first error determination signal output circuit having M flip-flops connected in a cascade arrangement and configured to output a first error determination signal from the final-stage flip-flop among the M flip-flops; a second error determination signal output circuit having N flip-flops connected in a cascade arrangement and configured to output a second error determination signal from the final-stage flip-flop among the N flip-flops; and a fault determination circuit configured to determine the presence or absence of a fault in the synchronous reset signal generation circuit based on the synchronous reset signal, the first error determination signal, and the second error determination signal. The first error determination signal is input to the initial-stage flip-flop among the N flip-flops. The clock signal and the asynchronous reset signal are commonly input to the L, M, and N flip-flops. L, M, and N are integers that fulfill $M \geq 2$, $L \geq M+1$, and $M+N \geq L+1$ simultaneously. (A first configuration.)

In the synchronous reset signal generation circuit of the first configuration described above, $L \geq M+2$ and $M+N \geq L+2$ may be fulfilled simultaneously. (A second configuration.)

In the synchronous reset signal generation circuit of the first or second configuration described above, each flip-flop in the synchronous reset signal output circuit, the first error determination signal output circuit, and the second error determination signal output circuit may have a data input terminal, a data output terminal, a clock input terminal, and an asynchronous reset input terminal. The clock signal may be input to the clock input terminal of each flip-flop, the asynchronous reset signal may be input to the asynchronous reset input terminal of each flip-flop, and between two mutually adjacent flip-flops, the output signal from the data output terminal of the former-stage flip-flop may be input to the data input terminal of the latter-stage flip-flop. Among the L flip-flops, a signal with a predetermined logic value may be input to the data input terminal of the initial-stage flip-flop, and the synchronous reset signal may be output from the data output terminal of the final-stage flip-flop. Among the M flip-flops, the signal with the predetermined logic value may be input to the data input terminal of the initial-stage flip-flop, and the first error determination signal may be output from the data output terminal of the final-stage flip-flop. Among the N flip-flops, the first error determination signal may be input to the data input terminal of the initial-stage flip-flop, and the second error determination signal may be output from the data output terminal of the final-stage flip-flop. (A third configuration.)

In the synchronous reset signal generation circuit of the third configuration described above, each flip-flop, when the asynchronous reset signal in an active state is input to it, may output from the data output terminal a signal with a first logic value, and each flip-flop, when the asynchronous reset signal in a non-active state is input to it, may hold the logic value of the input signal to the data input terminal in response to a predetermined level change in the clock signal and output from the data output terminal a signal with the held logic value. The predetermined logic value may be a second logic value. The synchronous reset signal with the first logic value may be a signal for resetting a logic circuit configured to operate in synchronization with the clock signal. (A fourth configuration.)

In the synchronous reset signal generation circuit of the fourth configuration described above, the fault determination circuit may determine the presence of the fault when the first and second error determination signals have the second logic value and in addition the synchronous reset signal has the first logic value. (A fifth configuration.)

In the synchronous reset signal generation circuit of the fourth or fifth configuration described above, the fault determination circuit may determine the presence of the fault when the first and second error determination signals have the first logic value and in addition the synchronous reset signal has the second logic value. (A sixth configuration.)

According to another aspect of the present disclosure, a digital processing device includes: the synchronous reset signal generation circuit of any of the first to sixth configurations described above; and a clock fault determination circuit. The clock fault determination circuit determines the presence or absence of a fault in the clock signal based on the clock signal and another clock signal, which is different from the clock signal. (A seventh configuration.)

In the digital processing device of the seventh configuration described above, the clock fault determination circuit may include: a frequency divider configured to generate a frequency-divided clock signal by dividing the frequency of the clock signal; and a monitoring circuit configured to monitor, using the other clock signal, the intervals of predetermined level changes in the frequency-divided clock signal. The clock fault determination circuit may be configured to determine, based on the result of the monitoring, the presence or absence of the fault in the clock signal or a fault in the frequency divider. (An eighth configuration.)

In the digital processing device of the eighth configuration described above, the frequency divider may be composed of a plurality of stages of frequency-division flip-flops each having a data input terminal, a data output terminal, and a clock input terminal. In each frequency-division flip-flop, the logically inverted signal of the output signal from the data output terminal may become the input signal to the data input terminal. Among the plurality of stages of frequency-division flip-flops, the clock signal may be input to the clock input terminal of the initial-stage frequency-division flip-flop; to the clock input terminal of each frequency-division flip-flop except the initial-stage frequency-division flip-flop, the output signal from the data output terminal of the frequency-division flip-flop in the preceding stage may be input; and the frequency-divided clock signal may be output from the data output terminal of the final-stage frequency-division flip-flop. (A ninth configuration.)

According to yet another aspect of the present disclosure, a digital processing device includes: a plurality of synchronous reset signal generation circuits including a first and a second synchronous reset signal generation circuit; and a plurality of clock fault determination circuits including a first and a second clock fault determination circuit. Used as each of the first and second synchronous reset signal generation circuits is the synchronous reset signal generation circuit of any of the first to sixth configurations described above. The clock signal in the first synchronous reset signal generation circuit and the clock signal in the second synchronous reset signal generation circuit are a first clock signal and a second clock signal respectively. The first clock fault determination circuit determines the presence or absence of a fault in the first clock signal based on the first and second clock signals. The second clock fault determination circuit determines the presence or absence of a fault in the second clock signal based on the second and first clock signals. (A tenth configuration.)

In the digital processing device of the tenth configuration described above, the first clock fault determination circuit may include: a first frequency divider configured to generate a first frequency-divided clock signal by dividing the frequency of the first clock signal; and a first monitoring circuit configured to monitor, using the second clock signal, the intervals of predetermined level changes in the first frequency-divided clock signal. The first clock fault determination circuit may be configured to determine, based on the result of the monitoring, the presence or absence of the fault in the first clock signal or a fault in the first frequency divider. The second clock fault determination circuit may include: a second frequency divider configured to generate a second frequency-divided clock signal by dividing the frequency of the second clock signal; and a second monitoring circuit configured to monitor, using the first clock signal, the intervals of predetermined level changes in the second frequency-divided clock signal. The second clock fault determination circuit may be configured to determine, based on the result of the monitoring, the presence or absence of the fault in the second clock signal or a fault in the second frequency divider. (An eleventh configuration.)

In the digital processing device of the eleventh configuration described above, the first and second frequency dividers may each be composed of a plurality of stages of frequency-division flip-flops each having a data input terminal, a data output terminal, and a clock input terminal. In each frequency-division flip-flop in each frequency divider, the logically inverted signal of the output signal from the data output terminal may become the input signal to the data input terminal. Among the plurality of stages of frequency-division flip-flops in the first frequency divider, the first clock signal may be input to the clock input terminal of the initial-stage frequency-division flip-flop; to the clock input terminal of each frequency-division flip-flop except the initial-stage frequency-division flip-flop, the output signal from the data output terminal of the frequency-division flip-flop in a the preceding stage may be input; and the first frequency-divided clock signal may be output from the data output terminal of the final-stage frequency-division flip-flop in the first frequency divider. Among the plurality of stages of frequency-division flip-flops in the second frequency divider, the second clock signal may be input to the clock input terminal of the initial-stage frequency-division flip-flop; to the clock input terminal of each frequency-division flip-flop except the initial-stage frequency-division flip-flop, the output signal from the data output terminal of the frequency-division flip-flop in the preceding stage may be input; and the second frequency-divided clock signal may be output from the data output terminal of the final-stage frequency-division flip-flop in the second frequency divider. (A twelfth configuration.)

Advantageous Effects of Disclosure

According to the present disclosure, it is possible to provide a synchronous reset signal generation circuit and a digital processing device that can satisfactorily determine and detect the presence or absence of a fault related to the resetting of synchronization.

DESCRIPTION OF EMBODIMENTS

Examples embodying the present disclosure will be described below with reference to the accompanying drawings. Among the different diagrams referred to in the course, the same parts are identified by the same reference signs, and in principle no overlapping description will be repeated. In the present description, for the sake of simplicity, symbols and reference signs referring to information, signals, physical quantities, elements, parts, and the like are occasionally used with omission or abbreviation of the names of the information, signals, physical quantities, elements, parts, and the like corresponding to those symbols and reference signs. For example, the asynchronous reset signal (see FIG. 1) described later and referred to by "RSTN" is sometimes mentioned as the asynchronous reset signal RSTN and is other times abbreviated to the reset signal RSTN or the signal RSTN, all designations referring to the same signal.

First, some terms used to describe embodiments of the present disclosure will be defined. "Level" denotes the level of a potential. For a given signal, high level is higher in potential than low level. For a given signal of interest, when the signal is at high level, the inversion signal (logically inverted signal) of the signal is at low level; when the signal of interest is at low level, the inversion signal (logically inverted signal) of the signal is at high level.

For a given signal, a transition from low level to high level is termed an up edge, and the timing of a transition from low level to high level is termed an up-edge timing. Likewise, for a given signal, a transition from high level to low level is termed a down edge, and the timing of a transition from high level to low level is termed a down-edge timing.

Figure 1:
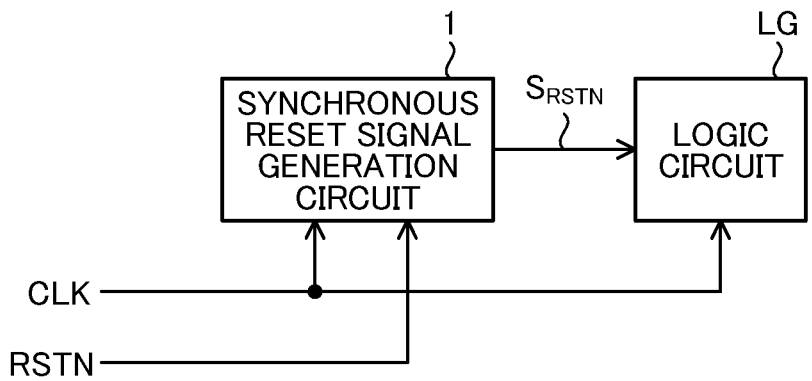
FIG. 1 is a schematic configuration diagram of a digital processing device according to an embodiment of the present disclosure.

FIG. 1 is a schematic configuration diagram of a digital processing device according to an embodiment of the present disclosure. The digital processing device shown in FIG. 1 includes a synchronous reset signal generation circuit 1 and a logic circuit LG.

The synchronous reset signal generation circuit 1 is fed with a clock signal CLK and an asynchronous reset signal RSTN. The clock signal CLK is a rectangular-wave signal with a predetermined clock frequency, and the signal level of the clock signal CLK switches periodically between high level and low level.

The asynchronous reset signal RSTN is a signal asynchronous with the clock signal CLK, and takes as its signal level high level or low level. The synchronous reset signal generation circuit 1 synchronizes the asynchronous reset signal RSTN with the clock signal CLK, and thereby generates a synchronous reset signal $S_{RSTN}$, which is a reset signal synchronous with the clock signal CLK.

It is here assumed that negative logic is adopted for the asynchronous reset signal RSTN and the synchronous reset signal $S_{RSTN}$. Accordingly, the reset signals RSTN and $S_{RSTN}$ are, when at low level, in an active state (asserted state) and, when at high level, in a non-active state (negated state).

Figure 2:
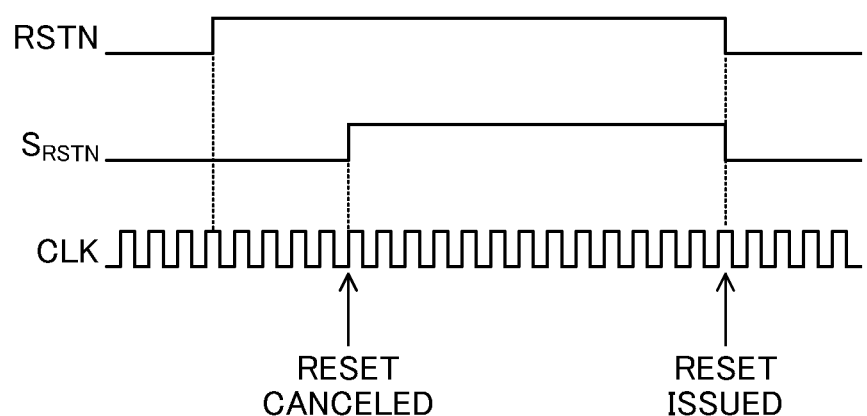
FIG. 2 is a signal waveform diagram associated with a synchronous reset signal generation circuit according to an embodiment of the present disclosure.

As shown in FIG. 2, when fed with the asynchronous reset signal RSTN at low level, the synchronous reset signal generation circuit 1 keeps the synchronous reset signal $S_{RSTN}$ at low level. When an up edge occurs in the asynchronous reset signal RSTN, then in synchronization with the up edge that subsequently occurs in the clock signal CLK, the synchronous reset signal generation circuit 1 produces an up edge in the synchronous reset signal $S_{RSTN}$. The delay from the up-edge timing of the signal RSTN to the up-edge timing of the signal $S_{RSTN}$ depends on the configuration of the synchronous reset signal generation circuit 1. When thereafter a down edge occurs in the asynchronous reset signal RSTN, the synchronous reset signal generation circuit 1 immediately produces a down edge in the synchronous reset signal $S_{RSTN}$ irrespective of the level of the clock signal CLK.

An up edge in the synchronous reset signal $S_{RSTN}$ has the function of canceling a reset, and a down edge in the synchronous reset signal $S_{RSTN}$ has the function of issuing a reset.

The logic circuit LG is fed with the clock signal CLK and the synchronous reset signal $S_{RSTN}$. The logic circuit LG is a circuit that operates in synchronization with the clock signal CLK, and includes a flip-flop or the like that operates in synchronization with the clock signal CLK. The logic circuit LG is fed with, in addition to the signals CLK and $S_{RSTN}$, various data signals (not illustrated). With the synchronous reset signal $S_{RSTN}$ at high level, the logic circuit LG performs ordinary operation based on the data signals. The ordinary operation is performed in synchronization with the clock signal CLK. On the other hand, with the synchronous reset signal $S_{RSTN}$ at low level, the logic circuit LG does not perform the ordinary operation; instead, the logic circuit LG (and hence the flip-flop included in it) is kept in a predetermined initial state.

Accordingly, with the logic circuit LG in the initial state, when an up edge occurs in the synchronous reset signal $S_{RSTN}$, the up edge functions to cancel a reset, and thereafter, starting in the initial state, the logic circuit LG starts the ordinary operation mentioned above. Thereafter, when a down edge occurs in the synchronous reset signal $S_{RSTN}$, the down edge functions to issue a reset, and thereafter the logic circuit LG is reset to the initial state (in other words, it is initialized). Thus the synchronous reset signal $S_{RSTN}$ at low level functions as a signal for resetting the logic circuit LG operating in synchronization with the clock signal CLK (i.e., for resetting the logic circuit LG to the initial state).

While FIG. 1 shows only one logic circuit LG, a digital processing device according to the embodiment may include a plurality of logic circuits LG. A digital processing device according to the embodiment may include a clock signal generation circuit that generates the clock signal CLK and an asynchronous reset signal generation circuit that generates the asynchronous reset signal RSTN (of which neither is illustrated).

Figure 3:
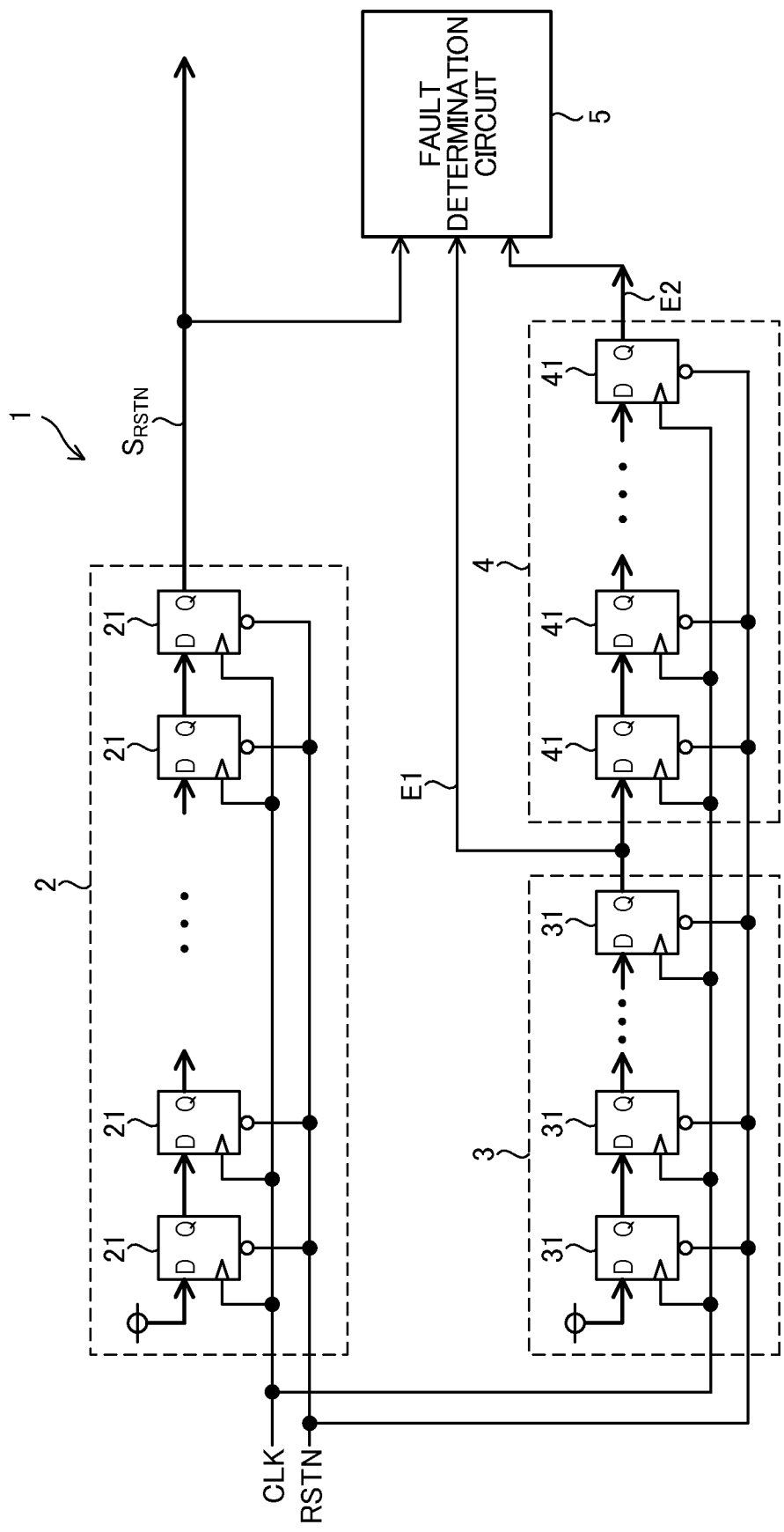
FIG. 3 is a configuration diagram of a synchronous reset signal generation circuit according to an embodiment of the present disclosure.

FIG. 3 is a configuration diagram of the synchronous reset signal generation circuit 1. The synchronous reset signal generation circuit 1 includes a synchronous reset signal output circuit 2, a first error determination signal output circuit 3, a second error determination signal output circuit 4, and a fault determination circuit 5.

Figure 4:
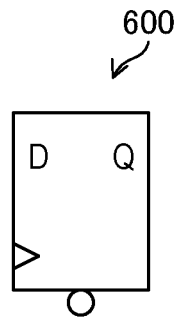
FIG. 4 is a diagram showing a flip-flop in an embodiment of the present disclosure.

The output circuits 2, 3, and 4 each include a plurality of flip-flops. Usable as each flip-flop provided in the output circuits 2, 3, and 4 is, for example, a flip-flop 600 as shown in FIG. 4.

The configuration and operation of the flip-flop 600 will be described. In the following description, a flip-flop is often abbreviated to a FF. The FF 600 is a positive-edge-triggered D flip-flop, which has a data input terminal (in the following description, referred to also as a D terminal), a data output terminal (in the following description, referred to also as a Q terminal), a clock input terminal, and an asynchronous reset input terminal (in the following description, referred to also as a reset input terminal). Negative logic is adopted for the reset input terminal of the FF 600. Accordingly, a low-level signal fed to the reset input terminal of the FF 600 is in an active state, and a high-level signal fed to the reset input terminal of the FF 600 is in a non-active state.

The FF 600 receives, at the D terminal, a signal that has a first logic value or a second logic value. The FF 600 outputs, from the Q terminal, a signal that has a first logic value or a second logic value. Here it is assumed that a signal having a first logic value is a low-level signal and that a signal having a second logic value is a high-level signal.

When the FF 600 is receiving, at the reset input terminal, a signal in an active state (here, a low-level signal), the FF 600 outputs, from the Q terminal, a signal having a first logic value, which corresponds to the logic level in a reset state. When the FF 600 is receiving, at the reset input terminal, a signal in a non-active state (here, a high-level signal), the FF 600 acquires and holds the logic value of the input signal to the D terminal in response to an up edge in the signal fed to the clock input terminal (more precisely, it acquires and holds the logic value of the input signal to the D terminal at an up-edge timing of the signal fed to the clock input terminal), and outputs, from the Q terminal, a signal having the so held logic value.

With reference back to FIG. 3, the output circuit 2 is composed of L FFs 21, the output circuit 3 is composed of M FFs 31, and the output circuit 4 is composed of N FFs 41. L, M, N, are each an integer of two or more, and the relationship to be fulfilled by those integers will be described later.

All the FFs 21, 31, and 41 in the output circuits 2, 3, and 4 are commonly fed with, at their clock input terminals, the clock signal CLK and, at their reset input terminals, the asynchronous reset signal RSTN.

The FFs 21, 31, and 41 have the same configuration as the FF 600, and operate in the same way as the FF 600. Thus, when the asynchronous reset signal RSTN is at low level, the FFs 21 output a low-level signal from their Q terminals. A similar description applies to FFs 31 and 41. On the other hand, when the asynchronous reset signal RSTN is at high level, the FFs 21 acquire and hold the logic value of the input signal to their D terminals in response to an up edge in the clock signal CLK (more precisely, they acquire and hold the logic value of the input signal to their D terminals at an up-edge timing of the clock signal CLK), and output, from their Q terminals, signals having the so held logic value. A similar description applies to the FFs 31 and 41.

More specifically, with respect to a given FF 21 of interest, when the asynchronous reset signal RSTN is at high level,
if the input signal to the D terminal at an up-edge timing of the clock signal CLK has the first logic value (low level), the FF 21 acquires and holds the first logic value in synchronization with an up edge in the clock signal CLK and outputs from the Q terminal a low-level signal, which corresponds to the held first logic value, and
if the input signal to the D terminal at an up-edge timing of the clock signal CLK has the second logic value (high level), the FF 21 acquires and holds the second logic value in synchronization with an up edge in the clock signal CLK and outputs from the Q terminal a high-level signal, which corresponds to the held second logic value.

A similar description applies to any of the FFs 31 and 41.

In the synchronous reset signal output circuit 2, the L FFs 21 are connected together in a cascade arrangement to constitute an L-stage shift register. That is, the L FFs 21 are composed of a first-stage FF 21 to an Lth-stage FF 21, wherein the Q terminal of the ith-stage FF 21 is connected to the D terminal of the (i+1)th-stage FF 21 so that the output signal from the Q terminal of the ith-stage FF 21 is fed to the D terminal of the (i+1)th-stage FF 21 (where i is an integer of one or more but less than L). That is, between mutually adjacent FFs 21, the output signal from the Q terminal of the former-stage FF 21 is fed to the D terminal of the latter-stage FF 21. The D terminal of the first-stage FF 21, i.e., the initial-stage FF 21, is constantly fed with a high-level signal (a signal having the second logic value). The output signal from the Q terminal of the Lth-stage FF 21, i.e., the final-stage FF 21, functions as the synchronous reset signal $S_{RSTN}$.

In the first error determination signal output circuit 3, the M FFs 31 are connected together in a cascade arrangement to constitute an M-stage shift register. That is, the M FFs 31 are composed of a first-stage FF 31 to an Mth-stage FF 31, wherein the Q terminal of the ith-stage FF 31 is connected to the D terminal of the (i+1)th-stage FF 31 so that the output signal from the Q terminal of the ith-stage FF 31 is fed to the D terminal of the (i+1)th-stage FF 31 (where i is an integer of one or more but less than M). That is, between mutually adjacent FFs 31, the output signal from the Q terminal of the former-stage FF 31 is fed to the D terminal of the latter-stage FF 31. The D terminal of the first-stage FF 31, i.e., the initial-stage FF 31, is constantly fed with a high-level signal (a signal having the second logic value). The output signal from the Q terminal of the Mth-stage FF 31, i.e., the final-stage FF 31, functions as a first error determination signal E1.

In the second error determination signal output circuit 4, the N FFs 41 are connected together in a cascade arrangement to constitute an N-stage shift register. That is, the N FFs 41 are composed of a first-stage FF 41 to an Nth-stage FF 41, wherein the Q terminal of the ith-stage FF 41 is connected to the D terminal of the (i+1)th-stage FF 41 so that the output signal from the Q terminal of the ith-stage FF 41 is fed to the D terminal of the (i+1)th-stage FF 41 (where i is an integer of one or more but less than N). That is, between mutually adjacent FFs 41, the output signal from the Q terminal of the former-stage FF 41 is fed to the D terminal of the latter-stage FF 41. The D terminal of the first-stage FF 41, i.e., the initial-stage FF 41, is connected to the Q terminal of the final-stage FF 31 in the output circuit 3. Thus the D terminal of the first-stage FF 41 in the output circuit 4 is fed with the first error determination signal E1. In the output circuit 4, the output signal from the Q terminal of the Nth-stage FF 41, i.e., the final-stage FF 41, functions as a second error determination signal E2.

Based on the synchronous reset signal $S_{RSTN}$ from the output circuit 2, the first error determination signal E1 from the output circuit 3, and the second error determination signal E2 from the output circuit 4, the fault determination circuit 5 determines the presence or absence of a fault in the synchronous reset signal generation circuit 1. The fault determination circuit 5 can feed an external circuit (i.e., a circuit different from the synchronous reset signal generation circuit 1; not illustrated in FIG. 3) with a signal indicating the result of the determination of the presence or absence of a fault. A fault can be of any kind including a breakdown, and denotes any state different from a normal state. When a breakdown occurs somewhere in the synchronous reset signal generation circuit 1, the synchronous reset signal generation circuit 1 has a fault.

The output circuits 3 and 4 are circuits provided to detect the presence or absence of a fault in the output circuit 2. Thus a fault that is detected to be present or absent by the fault determination circuit 5 can basically be understood as a fault in the output circuit 2 or in the synchronous reset signal $S_{RSTN}$. One chief cause of a fault in the synchronous reset signal $S_{RSTN}$ is a breakdown in the output circuit 2. However, as will be described later, the fault determination circuit 5 can be configured to be able to determine the presence or absence of a fault not only in the output circuit 2 but also in the output circuit 3 or 4, in which case the fault determination circuit 5 can be understood to be a part that determines the presence or absence of a fault in the output circuits 2 to 4 or in the synchronous reset signal $S_{RSTN}$. It should be noted that "determining" a fault can be understood to be synonymous with "detecting" a fault, and accordingly the fault determination circuit 5 can be understood to be a fault detection circuit that detects the presence or absence of a fault as mentioned above.

Figure 5:
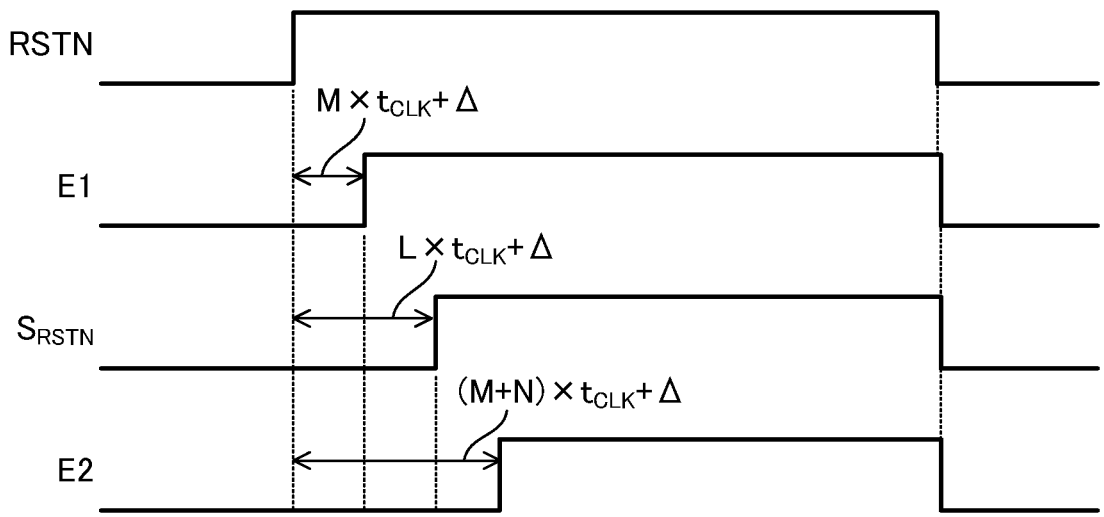
FIG. 5 is a signal waveform diagram, in a normal condition, associated with a synchronous reset signal generation circuit according to an embodiment of the present disclosure.

FIG. 5 shows a relationship among the signals RSTN, E1, $S_{RSTN}$, and E2 as observed in a condition where no fault is present in the synchronous reset signal generation circuit 1 (hereinafter referred to as the normal condition). In the normal condition, when, starting with a state where the signals RSTN, E1, $S_{RSTN}$, and E2 are all at low level, an up edge occurs in the asynchronous reset signal RSTN, first an up edge occurs in the first error determination signal E1, then an up edge occurs in the synchronous reset signal $S_{RSTN}$, and finally an up edge occurs in the second error determination signal E2. Let the period (the length of time of the cycle) of the clock signal CLK be $t_{CLK}$, then typically it is expected that, from the up-edge timing of the RSTN, the lapse of time until the up-edge timing of the signal E1 equals $M \times t_{CLK} + \Delta$, the lapse of time until the up-edge timing of the signal $S_{RSTN}$ equals $L \times t_{CLK} + \Delta$, and the lapse of time until the up-edge timing of the signal E2 equals $(M+N) \times t_{CLK} + \Delta$. The time $\Delta$ is shorter than the period $t_{CLK}$.

To allow the up edges to occur in the order described above, the number of stages L of FFs 21 in the output circuit 2 is set to be greater than the number of stages M of FFs 31 in the output circuit 3, and the total number of stages (M+N) of FFs 31 and 41 in the output circuits 3 and 4 is set to be greater than the number of stages L of FFs 21 in the output circuit 2. That is, M<L<M+N holds.

On the other hand, to prevent the final-stage FF 31 in the output circuit 3 from entering a metastable stage (in other words, to ensure that the first error determination signal E1 remains a signal reliably synchronized with the clock signal CLK), the number of stages M of FFs 31 in the output circuit 3 should be two or more. In summary, L, M, and N are integers that fulfill M≥2, L≥M+1, and M+N≥L+1 simultaneously.

Thus, if despite the signals E1 and E2 being at high level the signal $S_{RSTN}$ is at low level, it is possible to determine the presence of a fault in the circuit 1 (chiefly in the output circuit 2). This fault indicates a state where a reset cannot be canceled properly, and is thus called a reset cancellation error or a reset cancellation fault. A reset cancellation error occurs, for example, when a fault occurs in which the output signal of the final-stage FF 21 in the output circuit 2 is fixed at low level.

On the other hand, when the signal RSTN is at low level, the signals E1, $S_{RSTN}$, and E2 are all supposed to be at low level. Thus, if despite the signals E1 and E2 being at low level the signal $S_{RSTN}$ is at high level, it is possible to determine the presence of a fault in the circuit 1 (chiefly in the output circuit 2). This fault indicates a state where a reset cannot be issued properly, and is thus called a reset issuance error or a reset issuance fault. A reset issuance error occurs, for example, when a fault occurs in which the output signal of the final-stage FF 21 in the output circuit 2 is fixed at high level.

In the following description, a reset cancellation error and a reset issuance error are occasionally referred to as a reset error collectively.

The asynchronous reset signal RSTN is not synchronous with the clock signal CLK; thus when an up edge occurs in the asynchronous reset signal RSTN, in the output circuit 2, a FF 21 other than the final-stage one may enter a metastable state. A similar description applies to the output circuits 3 and 4. If after an up edge in the asynchronous reset signal RSTN a metastable state occurs only in the output circuit 3 out of the output circuits 2 and 3, an up edge in the signal E1 delays by one clock period as compared with if no metastable state occurs in the output circuit 3. In this situation, if L=M+1, up edges may not occur in such an order that, in response to an up edge in the asynchronous reset signal RSTN, first an up edge occurs in the first error determination signal E1 and then an up edge occurs in the synchronous reset signal $S_{RSTN}$. Likewise, if M+N=L+1, up edges may not occur in such an order that, in response to an up edge in the asynchronous reset signal RSTN, first an up edge occurs in the synchronous reset signal $S_{RSTN}$ and then an up edge occurs in the second error determination signal E2.

To preclude such possibilities, it is preferable that L, M, and N fulfill M≥2, L≥M+2, and M+N≥L+2 simultaneously. However, in a case where, for example, each FF is configured to avoid entering a metastable state, a design where L=M+1 and M+N=L+1 simultaneously can work with no practical problem.

With a configuration according to the embodiment, it is possible to accurately and quickly determine the presence or absence of a fault related to a synchronous reset signal (i.e., the presence or absence of a reset error). It is thus possible to prevent trouble in a system (a system including a digital processing device) through protection operation invoked by occurrence of such a fault. It is thus possible to build a system with high reliability or high safety.

Some specific examples of the configuration and operation of the digital processing device described above (in particular, the synchronous reset signal generation circuit 1) will be described below by way of a first to a ninth practical example. Any of the features described above in connection with the embodiment is, unless otherwise stated or unless inconsistent, applicable to any of the first to ninth practical examples described below. In a given practical example, for any feature inconsistent with one described previously, the description of that feature given in connection with that practical example can prevail. Unless inconsistent, any of the features of any one of the practical examples is applicable to any other of them (i.e., any two or more of the first to ninth practical examples can be implemented in combination).

First Practical Example

Figure 6:
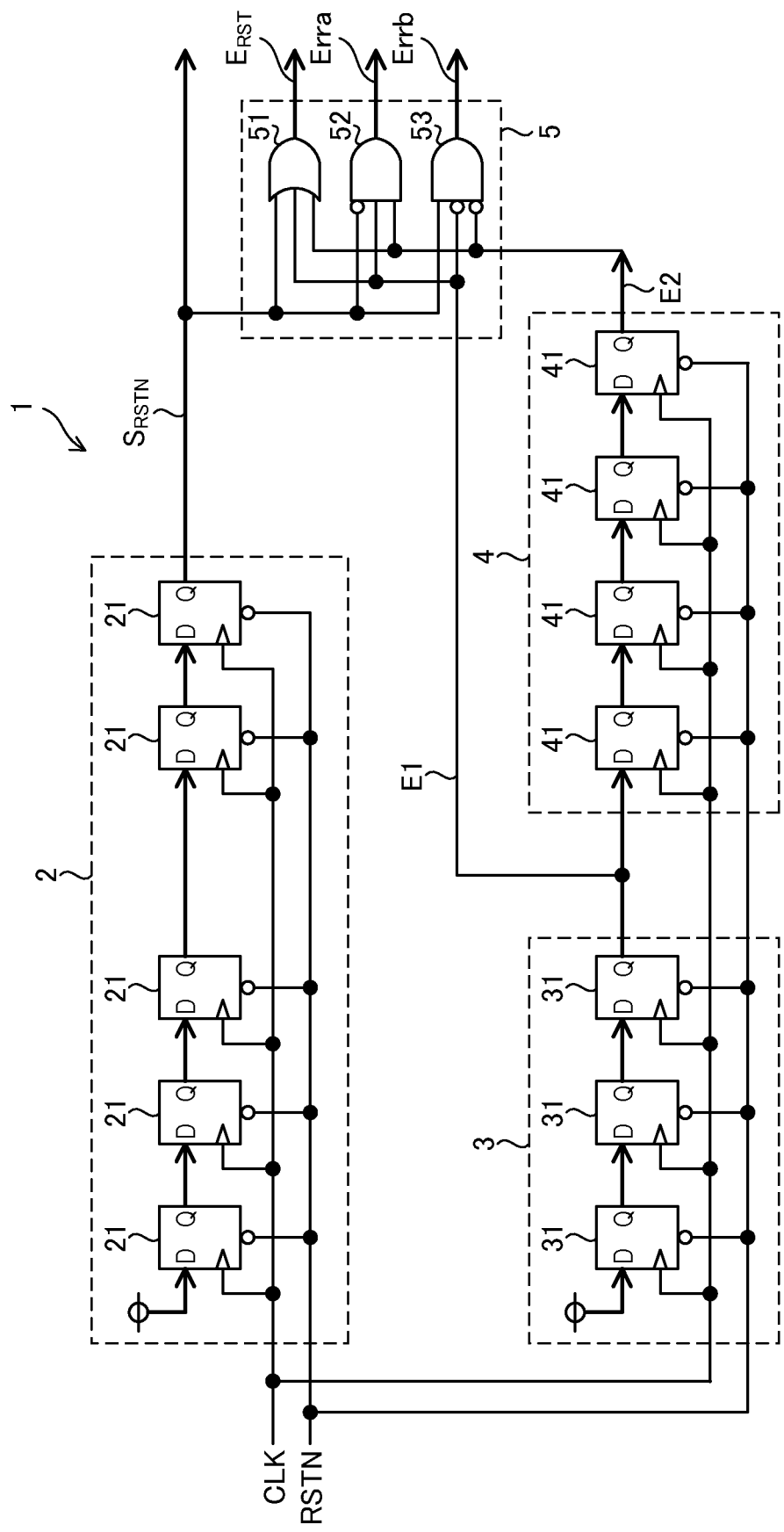
FIG. 6 is a configuration diagram of a synchronous reset signal generation circuit in a first practical example of the present disclosure.

A first practical example of the present disclosure will be described. FIG. 6 is a configuration diagram of the synchronous reset signal generation circuit 1 of the first practical example. The first practical example employs the design where (L,M,N)=(5,3,4). In this case, the synchronous reset signal output circuit 2 can be considered divided in two parts: a former-stage part composed of the first- to third-stage FFs 21 and a latter-stage part composed of the fourth- to fifth-stage FFs 21. The former-stage part has the same configuration as the first error determination signal output circuit 3, and adding the latter-stage part to the former-stage part can be understood to contribute to fulfilling L≥M+2.

In the first practical example, the fault determination circuit 5 includes an OR circuit 51, and circuits 52 and 53. The OR circuit 51 outputs, as a reset signal $E_{RST}$ for an error handling circuit, the OR signal of the signals $S_{RSTN}$, E1, and E2. The AND circuit 52 outputs, as a reset cancellation error determination signal Erra, the AND signal of the inversion signal of the signal $S_{RSTN}$ and the signals E1 and E2. The AND circuits 53 outputs, as a reset issuance error determination signal Errb, the AND signal of the signal $S_{RSTN}$, the inversion signal of the first error determination signal E1, and the inversion signal of the second error determination signal E2.

The reset cancellation error determination signal Erra is at high level only when the signals E1 and E2 are at high level and in addition the signal $S_{RSTN}$ at low level, and is otherwise at low level. The signal Erra, when at high level, indicates the occurrence and presence of a reset cancellation error and, when at low level, does not indicate the occurrence and presence of a reset cancellation error.

The reset issuance error determination signal Errb is at high level only when the signals E1 and E2 are at low level and in addition the signal $S_{RSTN}$ at high level, and is otherwise at low level. The signal Errb, when at high level, indicates the occurrence and presence of a reset issuance error and, when at low level, does not indicate the occurrence and presence of a reset issuance error.

The signals Erra and Errb are transmitted to an error handling circuit (not illustrated). Based on the signals Erra and Errb, the error handling circuit performs predetermined error handling. Specifically, for example, on receiving the signal Erra or Errb at high level, the error handling circuit performs predetermined operation for coping with error occurrence as error handling.

The error handling circuit too can operate in synchronization with the clock signal CLK and, like the logic circuit LG in FIG. 1, is in an initial state so long as the synchronous reset signal $S_{RSTN}$ is at low level so as not to perform error handling in principle. However, to allow the error handling circuit to function effectively on occurrence of a reset error, the error handling circuit is fed with the reset signal $E_{RST}$ so that, when the reset signal $E_{RST}$ is at high level, irrespective of the synchronous reset signal $S_{RSTN}$, the error handling circuit is released from a reset state to perform error handling. The error handling circuit may include a circuit that operates asynchronously with the clock signal CLK so that this circuit performs error handling including operation for coping with error occurrence. In that case, the OR circuit 51 and the reset signal $E_{RST}$ are not necessary.

Second Practical Example

Figure 7:
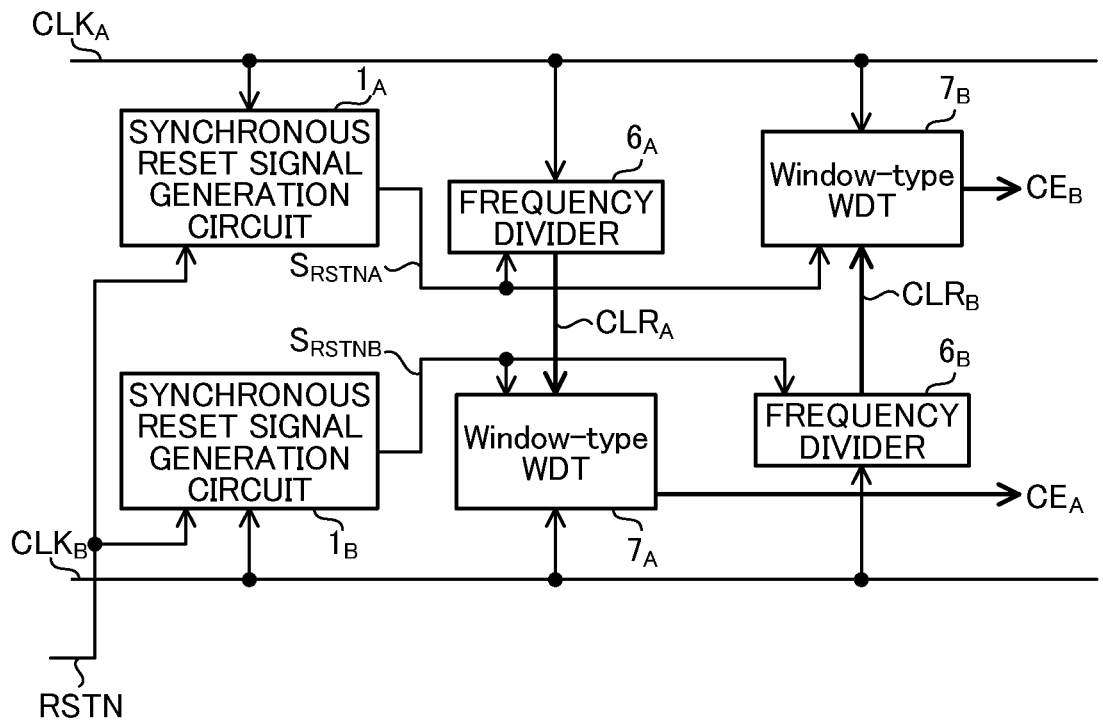
FIG. 7 is a configuration diagram of a digital processing device in a second practical example of the present disclosure.

A second practical example of the present disclosure will be described. A digital processing device according to the embodiment may include a plurality of synchronous reset signal generation circuits 1. In the second practical example, the digital processing device is assumed to include two synchronous reset signal generation circuits 1. FIG. 7 is a configuration diagram of the digital processing device of the second practical example. The digital processing device of the second practical example includes two synchronous reset signal generation circuits 1, of which one will be referred to by the reference sign $1_A$ and the other by the reference sign $1_B$. The clock signals for the synchronous reset signal generation circuits $1_A$ and $1_B$ will be referred to as the clock signals $CLK_A$ and $CLK_B$ respectively. The clock signals $CLK_A$ and $CLK_B$ are clock signals CLK that are asynchronous with each other.

The circuits $1_A$ and $1_B$ are commonly fed with an asynchronous reset signal RSTN. The synchronous reset signals $S_{RSTN}$ generated by the circuits $1_A$ and $1_B$ will be referred to as the synchronous reset signals $S_{RSTNA}$ and $S_{RSTNB}$ respectively. The circuit $1_A$ synchronizes the asynchronous reset signal RSTN with the clock signal $CLK_A$, and thereby generates the synchronous reset signal $S_{RSTNA}$, which is a reset signal synchronous with the clock signal $CLK_A$. The circuit $1_B$ synchronizes the asynchronous reset signal RSTN with the clock signal $CLK_B$, and thereby generates the synchronous reset signal $S_{RSTNB}$, which is a reset signal synchronous with the clock signal $CLK_B$.

The circuits $1_A$ and $1_B$ each have a configuration similar to and operate in a way similar to the synchronous reset signal generation circuit 1 described previously. The digital processing device of the second practical example may include a first and a second clock signal generation circuit that generate the clock signals $CLK_A$ and $CLK_B$ and an asynchronous reset signal generation circuit that generates the asynchronous reset signal RSTN (of which none is illustrated).

The digital processing device of the second practical example includes a first clock fault determination circuit for determining the presence or absence of a fault in the clock signal $CLK_A$ and a second clock fault determination circuit for determining the presence or absence of a fault in the clock signal $CLK_B$.

Each clock fault determination circuit includes a frequency divider and a watch dog timer (in the following description referred to as a WDT). The WDT is configured as a window WDT. The first clock fault determination circuit includes, as the frequency divider and the WDT, a frequency divider $6_A$ and a WDT $7_A$, and the second clock fault determination circuit includes, as the frequency divider and the WDT, a frequency divider $6_B$ and a WDT $7_B$.

The frequency divider $6_A$ is fed with the clock signal $CLK_A$ and the synchronous reset signal $S_{RSTNA}$. During the period in which the synchronous reset signal $S_{RSTNA}$ is at high level (in a non-active state), the frequency divider $6_A$ divides the frequency of the clock signal $CLK_A$ in a predetermined frequency division ratio to generate a frequency-divided clock signal. The frequency-divided clock signal generated by the frequency divider $6_A$ is fed, as a clear signal $CLR_A$, to the WDT $7_A$. During the period in which the synchronous reset signal $S_{RSTNA}$ is at low level (in an active state), the frequency divider $6_A$ does not perform frequency division operation and the clear signal $CLR_A$ is kept at low level.

The WDT $7_A$ is fed with the clock signal $CLK_B$, the clear signal $CLR_A$, and the synchronous reset signal $S_{RSTNB}$. An up edge in the clear signal $CLR_A$ elicits clear control on the WDT $7_A$. During the period in which the synchronous reset signal $S_{RSTNB}$ is at high level (in a non-active state), the WDT $7_A$ performs a first WDT operation. In the first WDT operation, the WDT $7_A$ determines the presence or absence of a fault in the clock signal $CLK_A$ by monitoring, using the clock signal $CLK_B$, the intervals at which up edges occur in the clear signal $CLR_A$ (i.e., the intervals at which transitions from low level to high level occur in the clear signal $CLR_A$). The WDT $7_A$ outputs the result of the determination as a clock error determination signal $CE_A$. Incidentally, also when some fault occurs in the frequency divider $6_A$, the intervals at which up edges occur in the clear signal $CLR_A$ become abnormal and a fault is determined to be present in the WDT $7_A$. Accordingly, the WDT $7_A$ can be understood to determine, through the monitoring mentioned above, the presence or absence of a fault in the clock signal $CLK_A$ or in the frequency divider $6_A$.

The clock error determination signal $CE_A$ is a binary signal that takes as its signal level either high level or low level. The clock error determination signal $CE_A$, when at high level, indicates the presence of a fault in the clock signal $CLK_A$ or in the frequency divider $6_A$ and, when at low level, does not indicate the presence of a fault in the clock signal $CLK_A$ or in the frequency divider $6_A$. During the period in which the synchronous reset signal $S_{RSTNB}$ is at low level (in an active state), the first WDT operation is not performed, and the clock error determination signal $CE_A$ is at low level.

More specifically, for example, the WDT $7_A$ includes a counter that counts a value $CNT_A$. In the first WDT operation, the counter in the WDT $7_A$ increments the value $CNT_A$ by one each time an up edge occurs in the clock signal $CLK_B$, and resets the value $CNT_A$ when an up edge occurs in the clear signal $CLR_A$ (i.e., it substitutes "0" in the value $CNT_A$). The initial value of the value $CNT_A$ is "0", and when the synchronous reset signal $S_{RSTNB}$ is at low level, the value $CNT_A$ is reset (so that $CNT_A=0$).

So long as the clock signal $CLK_A$ and the frequency divider $6_A$ are normal, up edges should occur in the clear signal $CLR_A$ at constant intervals, and accordingly in the first WDT operation it should not occur that the value $CNT_A$ reaches a predetermined upper-limit value $REF\_H_A$ or that an up edge occurs in the clear signal $CLR_A$ before the value $CNT_A$ reaches a predetermined lower-limit value $REF\_L_A$. Thus, the WDT $7_A$, while keeping the clock error determination signal $CE_A$ at low level in principle, determines the presence of a fault in the clock signal $CLK_A$ or in the frequency divider $6_A$ and outputs the clock error determination signal $CE_A$ at high level when, in the first WDT operation, the value $CNT_A$ reaches the predetermined upper-limit value $REF\_H_A$ or an up edge occurs in the clear signal $CLR_A$ before the value $CNT_A$ reaches the predetermined lower-limit value $REF\_L_A$. The clock error determination signal $CE_A$ is expected to turn to high level, for example, when the generation circuit for the clock signal $CLK_A$ or the frequency divider $6_A$ breaks down, or when the conductor that transmits the clock signal $CLK_A$ breaks. The upper- and lower-limit values $REF\_H_A$ and $REF\_L_A$ fulfill $REF\_H_A > REF\_L_A > 0$, and are determined based on the design values of the frequencies of the clock signals $CLK_A$ and $CLK_B$.

The frequency divider $6_B$ is fed with the clock signal $CLK_B$ and the synchronous reset signal $S_{RSTNB}$. During the period in which the synchronous reset signal $S_{RSTNB}$ is at high level (in a non-active state), the frequency divider $6_B$ divides the frequency of the clock signal $CLK_B$ in a predetermined frequency division ratio to generate a frequency-divided clock signal. The frequency-divided clock signal generated by the frequency divider $6_B$ is fed, as a clear signal $CLR_B$, to the WDT $7_B$. During the period in which the synchronous reset signal $S_{RSTNB}$ is at low level (in an active state), the frequency divider $6_B$ does not perform frequency division operation and the clear signal $CLR_B$ is kept at low level.

The WDT $7_B$ is fed with the clock signal $CLK_A$, the clear signal $CLR_B$, and the synchronous reset signal $S_{RSTNA}$. An up edge in the clear signal $CLR_B$ elicits clear control on the WDT $7_B$. During the period in which the synchronous reset signal $S_{RSTNA}$ is at high level (in a non-active state), the WDT $7_B$ performs a second WDT operation. In the second WDT operation, the WDT $7_B$ determines the presence or absence of a fault in the clock signal $CLK_B$ by monitoring, using the clock signal $CLK_A$, the intervals at which up edges occur in the clear signal $CLR_B$ (i.e., the intervals at which transitions from low level to high level occur in the clear signal $CLR_B$). The WDT $7_B$ outputs the result of the determination as a clock error determination signal $CE_B$. Incidentally, also when some fault occurs in the frequency divider $6_B$, the intervals at which up edges occur in the clear signal $CLR_B$ become abnormal and a fault is determined to be present in the WDT $7_B$. Accordingly, the WDT $7_B$ can be understood to determine, through the monitoring mentioned above, the presence or absence of a fault in the clock signal $CLK_B$ or in the frequency divider $6_B$.

The clock error determination signal $CE_B$ is a binary signal that takes as its signal level either high level or low level. The clock error determination signal $CE_B$, when at high level, indicates that a fault is present in the clock signal $CLK_B$ or in the frequency divider $6_B$ and, when at low level, does not indicate the presence of a fault in the clock signal $CLK_B$ or in the frequency divider $6_B$. During the period in which the synchronous reset signal $S_{RSTNA}$ is at low level (in an active state), the second WDT operation is not performed, and the clock error determination signal $CE_B$ is at low level.

More specifically, for example, the WDT $7_B$ includes a counter that counts a value $CNT_B$. In the second WDT operation, the counter in the WDT $7_B$ increments the value $CNT_B$ by one each time an up edge occurs in the clock signal $CLK_A$, and resets the value $CNT_B$ when an up edge occurs in the clear signal $CLR_B$ (i.e., it substitutes "0" in the value $CNT_B$). The initial value of the value $CNT_B$ is "0", and when the synchronous reset signal $S_{RSTNA}$ is at low level, the value $CNT_B$ is reset (so that $CNT_B=0$).

So long as the clock signal $CLK_B$ and the frequency divider $6_B$ are normal, up edges should occur in the clear signal $CLR_B$ at constant intervals, and accordingly in the second WDT operation it should not occur that the value $CNT_B$ reaches a predetermined upper-limit value $REF\_H_B$ or that an up edge occurs in the clear signal $CLR_B$ before the value $CNT_B$ reaches a predetermined lower-limit value $REF\_L_B$. Thus, the WDT $7_B$, while keeping the clock error determination signal $CE_B$ at low level in principle, determines the presence of a fault in the clock signal $CLK_B$ or in the frequency divider $6_B$ and outputs the clock error determination signal $CE_B$ at high level when, in the second WDT operation, the value $CNT_B$ reaches the predetermined upper-limit value $REF\_H_B$ or an up edge occurs in the clear signal $CLR_B$ before the value $CNT_B$ reaches the predetermined lower-limit value $REF\_L_B$. The clock error determination signal $CE_B$ is expected to turn to high level, for example, when the generation circuit for the clock signal $CLK_B$ or the frequency divider $6_B$ breaks down, or when the conductor that transmits the clock signal $CLK_B$ breaks. The upper- and lower-limit values $REF\_H_B$ and $REF\_L_B$ fulfill $REF\_H_B > REF\_L_B > 0$, and are determined based on the design values of the frequencies of the clock signals $CLK_A$ and $CLK_B$.

In the following description, a fault indicated by the clock error determination signal $CE_A$ or $CE_B$ at high level will be referred to as a clock error.

As described above, providing a clock fault determination circuit makes it possible to detect a clock error. A synchronous reset signal generation circuit ($1_A$ and $1_B$), while being able to detect a reset error, cannot detect a clock error. Adding a clock fault determination circuit to a synchronous reset signal generation circuit makes it possible to detect both a reset error and a clock error, and it is thus possible to build a system (a system including a digital processing device) with high reliability.

Moreover, with the configuration in FIG. 7, it is possible to monitor the presence or absence of a fault in two clock signals mutually.

The WDT $7_A$ functions as a first monitoring circuit that monitors, using the clock signal $CLK_B$, the intervals at which predetermined level changes occur in a frequency-divided clock signal (clear signal $CLR_A$) based on the clock signal $CLK_A$. The WDT $7_B$ functions as a second monitoring circuit that monitors, using the clock signal $CLK_A$, the intervals at which predetermined level changes occur in a frequency-divided clock signal (clear signal $CLR_B$) based on the clock signal $CLK_B$. While the operation specifically described above assumes that such predetermined level changes are up edges, predetermined level changes may instead be down edges.

Figure 8:
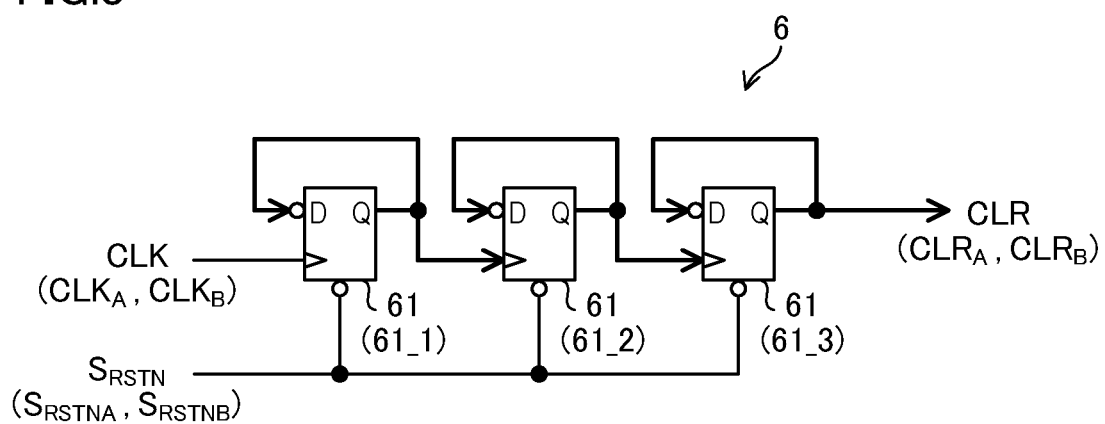
FIG. 8 is a configuration diagram of a frequency divider in the second practical example of the present disclosure.

FIG. 8 shows a configuration example of a frequency divider 6. The frequency divider 6 in FIG. 8 can be used as the frequency divider $6_A$, and can be used also as the frequency divider $6_B$. The frequency divider 6 is fed with the clock signal CLK and the synchronous reset signal $S_{RSTN}$, and outputs as a clear signal CLR a frequency-divided clock signal obtained by dividing the frequency of the clock signal CLK. In a case where the frequency divider 6 is used as the frequency divider $6_A$, the signals CLK, the $S_{RSTN}$, and CLR can be regarded as the signals $CLK_A$, $S_{RSTNA}$, and $CLR_A$ respectively; in a case where the frequency divider 6 is used as the frequency divider $6_B$, the signals CLK, $S_{RSTN}$, and CLR can be regarded as the signals $CLK_B$, $S_{RSTNB}$, and $CLR_B$ respectively.

The configuration and operation of the frequency divider 6 will be described. The frequency divider 6 is composed of a plurality of stages of flip-flops 61 (FFs 61). In the example shown in FIG. 8, three FFs 61 constitute the frequency divider 6. Where distinction is needed among the three FFs 61, they will be referred to by the reference signs "61_1", "61_2", and "61_3". The FFs 61_1, 61_2, and 61_3 are the first-stage (initial-stage), second-stage, and third-stage (final-stage) FF 61 respectively.

Used as each FF 61 is the FF 600 shown in FIG. 4. All the FFs 61 constituting the frequency divider 6 receive, at their reset input terminals, the synchronous reset signal $S_{RSTN}$. In each of the FFs 61 constituting the frequency divider 6, the inversion signal (logically inverted signal) of the output signal from the Q terminal becomes the input signal to the D terminal. That is, let i be an integer, then the inversion signal (logically inverted signal) of the output signal from the Q terminal of the FF 61_i becomes the input signal to the D terminal of the FF 61_i.

The initial-stage FF 61 (i.e., FF 61_1) receives at its clock input terminal the clock signal CLK (i.e., the clock signal $CLK_A$ for the frequency divider $6_A$ and the clock signal $CLK_B$ for the frequency divider $6_B$). Each FF 61 except the initial-stage FF 61 receives at its clock input terminal the output signal from the Q terminal of the FF 61 in the preceding stage. That is, the second-stage FF61_2 receives at its clock input terminal the output signal from the Q terminal of the first-stage FF 61_1, and the third-stage FF61_3 receives at its clock input terminal the output signal from the Q terminal of the second-stage FF 61_2. The final-stage FF 61_3 outputs at its Q terminal the clear signal CLR as a frequency-divided clock signal (i.e., the clear signal $CLR_A$ for the frequency divider $6_A$ and the clear signal $CLR_B$ for the frequency divider $6_B$).

The frequency-divided clock signal output from the Q terminal of the FF 61_3 is a signal resulting from dividing the frequency of the clock signal CLK in a frequency division ratio of 8. While FIG. 8 shows a configuration where the number of stages of (the number of) FFs 61 is three, the number of stages of (the number of) FFs 61 may be other than three. Where n stages of FF 61 are provided, the frequency division ratio equals $2^n$ (two to the power of n, where n is a natural number).

A frequency divider may be built using a counter; however, with the configuration of the frequency divider 6 in FIG. 8, a breakdown in any of the paths across which the clear signal CLR is generated from the clock signal CLK causes the clear signal CLR to cease to exhibit normal level changes (i.e., there is no path that masks the breakdown), it is possible to detect a fault in the frequency divider 6 itself reliably with a WDT.

Third Practical Example

Figure 9:
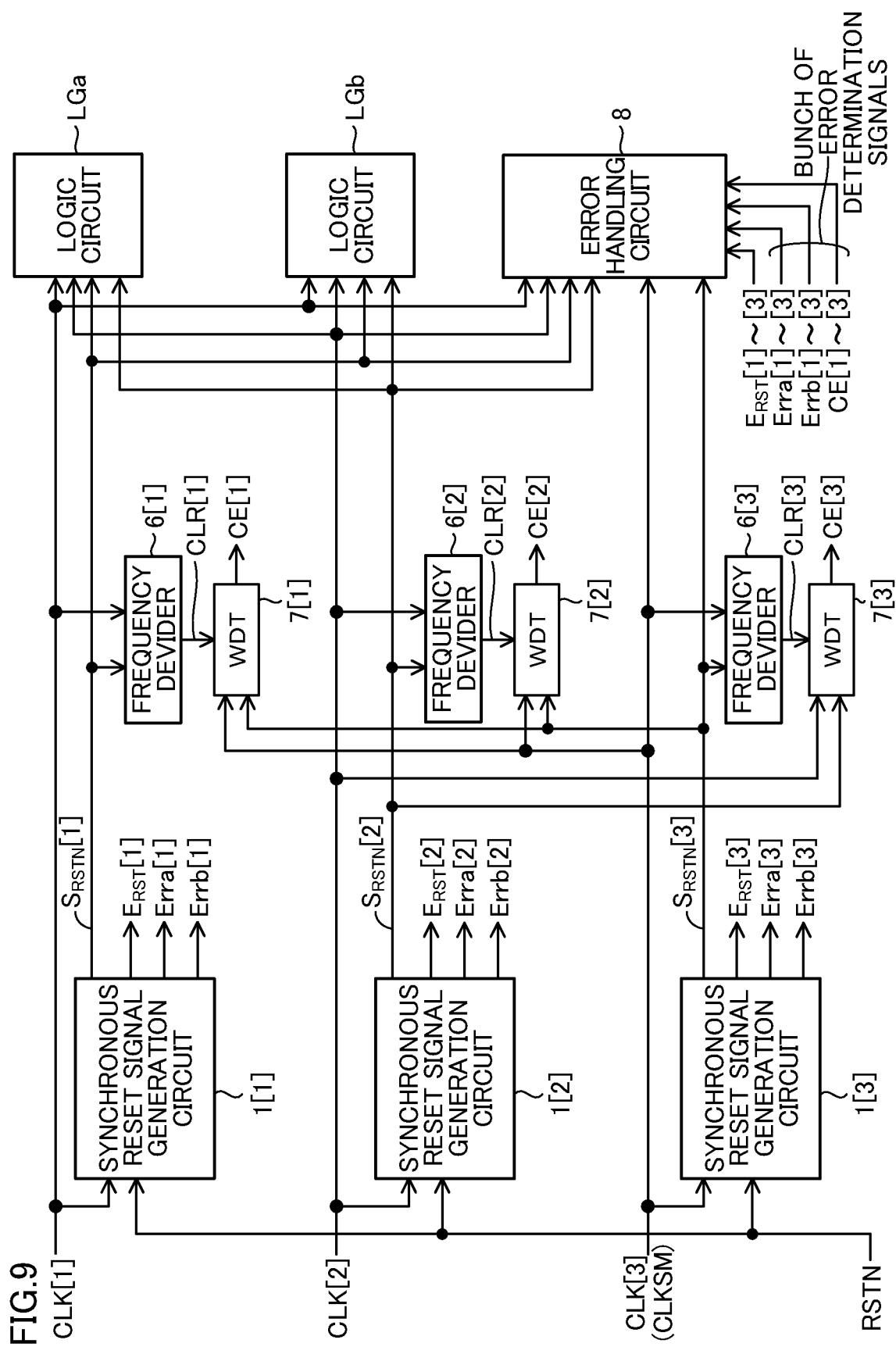
FIG. 9 is a configuration diagram of a digital processing device in a third practical example of the present disclosure.

A third practical example of the present disclosure will be described. FIG. 9 is a configuration diagram of a digital processing device of the third practical example. The digital processing device of the third practical example includes three synchronous reset signal generation circuits 1. Here, the three synchronous reset signal generation circuits 1 will be referred to by the reference signs 1[1], 1[2], and 1[3]. The synchronous reset signal generation circuits 1[1] to 1[3] are fed with clock signals that are asynchronous with each other. The clock signals CLK for the synchronous reset signal generation circuits 1[1] to 1[3] will be referred to by the reference signs CLK[1], CLK[2], and CLK[3] respectively. It is assumed that the synchronous reset signal generation circuits 1[1] to 1[3] each have the same configuration as the synchronous reset signal generation circuit 1 (see FIG. 6) of the first practical example, and the signals $S_{RSTN}$, $E_{RST}$, Erra, and Errb output from the synchronous reset signal generation circuit 1 [i] in particular will be referred to as the signals $S_{RSTN}$[i], $E_{RST}$[i], Erra[i], and Errb[i] respectively, where i is any integer. The synchronous reset signal generation circuits 1[1] to 1[3] are fed commonly with an asynchronous reset signal RSTN.

Incidentally, the digital processing device of the second practical example may include a first to a third clock signal generation circuit that generate the CLK[1] to CLK[3] and an asynchronous reset signal generation circuit that generates the asynchronous reset signal RSTN (of which none is illustrated).

The synchronous reset signal generation circuit 1 [i] synchronizes the asynchronous reset signal RSTN with the clock signal CLK[i], and thereby generates a synchronous reset signal $S_{RSTN}$[i], which is a reset signal synchronous with the clock signal CLK[i]. The reset signals RSTN and $S_{RSTN}$[i] are, when at low level, in an active state (in an asserted state) and, when at high level, in a non-active state (in a negated state). A fault determination circuit 5 (see FIG. 6) provided in the synchronous reset signal generation circuit 1[i] outputs, for an error handling circuit, a reset signal $E_{RST}$[i], a reset cancellation error determination signal Erra[i], and a reset issuance error determination signal Errb[i].

Figure 10:
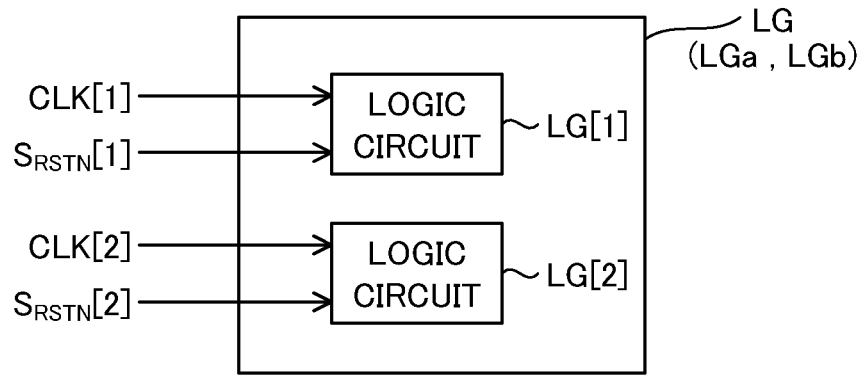
FIG. 10 is an internal configuration diagram of the logic circuit in FIG. 9.

The digital processing device of the third practical example includes logic circuits LGa and LGb. The logic circuits LGa and LGb are each fed with the clock signals CLK[1] and CLK[2] as well as the synchronous reset signals $S_{RSTN}$[1] and $S_{RSTN}$[2]. The logic circuits LGa and LGb comprise two logic circuits LG; as shown in FIG. 10, each logic circuit LG (i.e., each of the logic circuits LGa and LGb) includes logic circuits LG[1] and LG[2].

The logic circuit LG[i], which can be the logic circuit LG[1] or LG[2], will be described. The logic circuit LG[i] is fed with the clock signal CLK[i] and the synchronous reset signal $S_{RSTN}$[i]. The logic circuit LG[i] is a circuit that operates in synchronization with the clock signal CLK[i], and includes a flip-flop or the like that operates in synchronization with the clock signal CLK[i]. The logic circuit LG[i] is fed with, in addition to the signals CLK[i] and $S_{RSTN}$[i], various data signals (not illustrated). With the synchronous reset signal $S_{RSTN}$[i] at high level, the logic circuit LG[i] performs ordinary operation based on the data signals. The ordinary operation of the logic circuit LG[i] is performed in synchronization with the clock signal CLK[i]. On the other hand, with the synchronous reset signal $S_{RSTN}$[i] at low level, the logic circuit LG[i] does not perform the just-mentioned ordinary operation; instead, the logic circuit LG[i] (and hence the flip-flop included in it) is kept in a predetermined initial state.

Accordingly, with the logic circuit LG[i] in the initial state, when an up edge occurs in the synchronous reset signal $S_{RSTN}$[i], the up edge functions to cancel a reset, and thereafter, starting in the initial state, the logic circuit LG[i] starts the ordinary operation mentioned above. Thereafter, when a down edge occurs in the synchronous reset signal $S_{RSTN}$[i], the down edge functions to issue a reset, and thereafter the logic circuit LG[i] is reset to the initial state (in other words, it is initialized). Thus the synchronous reset signal $S_{RSTN}$[i] at low level functions as a signal for resetting the logic circuit LG[i] operating in synchronization with the clock signal CLK[i] (i.e., for resetting the logic circuit LG[i] to the initial state).

The digital processing device of the third practical example includes: a clock fault determination circuit which is composed of a frequency divider 6[1] and a WDT 7[1] and which serves to determine the presence or absence of a fault in the clock signal CLK[1]; a clock fault determination circuit which is composed of a frequency divider 6[2] and a WDT 7[2] and which serves to determine the presence or absence of a fault in the clock signal CLK[2]; and a clock fault determination circuit which is composed of a frequency divider 6[3] and a WDT 7[3] and which serves to determine the presence or absence of a fault in the clock signal CLK[3]. The clear signal that is fed from the frequency divider 6[i] to the WDT 7[i] will be referred to by the reference sign CLR[i].

The frequency divider 6[1] is fed with the clock signal CLK[1] and the synchronous reset signal $S_{RSTN}$[1], and the WDT 7[1] is fed with the clear signal CLR[1], the clock signal CLK[3], and the synchronous reset signal $S_{RSTN}$[3]. The clock fault determination circuit composed of the frequency divider 6[1] and the WDT 7[1] determines, based on the clock signals CLK[1] and CLK[3], the presence or absence of a fault in the CLK[1] (or the presence or absence of a fault in the frequency divider 6[1]), and generates and outputs a clock error determination signal CE[1] indicating the result of the determination.

The frequency divider 6[1] and the WDT 7[1] can be regarded as having the same configuration and operating in the same way as the frequency divider $6_A$ and the WDT $7_A$ in FIG. 7. In that case, the signals CLK[1], $S_{RSTN}$[1], CLK[3], $S_{RSTN}$[3], CLR[1], and CE[1] in FIG. 9 can be regarded as the signals $CLK_A$, $S_{RSTNA}$, $CLK_B$, $S_{RSTNB}$, $CLR_A$, and $CE_A$, respectively, in FIG. 7.

The frequency divider 6[2] is fed with the clock signal CLK[2] and the synchronous reset signal $S_{RSTN}$[2], and the WDT 7[2] is fed with the clear signal CLR[2], the clock signal CLK[3], and the synchronous reset signal $S_{RSTN}$[3]. The clock fault determination circuit composed of the frequency divider 6[2] and the WDT 7[2] determines, based on the clock signals CLK[2] and CLK[3], the presence or absence of a fault in the CLK[2] (or the presence or absence of a fault in the frequency divider 6[2]), and generates and outputs a clock error determination signal CE[2] indicating the result of the determination.

The frequency divider 6[2] and the WDT 7[2] can be regarded as having the same configuration and operating in the same way as the frequency divider $6_A$ and the WDT $7_A$ in FIG. 7. In that case, the signals CLK[2], $S_{RSTN}$[2], CLK[3], $S_{RSTN}$[3], CLR[2], and CE[2] in FIG. 9 can be regarded as the signals $CLK_A$, $S_{RSTNA}$, $CLK_B$, $S_{RSTNB}$, $CLR_A$, and $CE_A$, respectively, in FIG. 7.

The frequency divider 6[3] is fed with the clock signal CLK[3] and the synchronous reset signal $S_{RSTN}$[3], and the WDT 7[3] is fed with the clear signal CLR[3], the clock signal CLK[2], and the synchronous reset signal $S_{RSTN}$[2]. The clock fault determination circuit composed of the frequency divider 6[3] and the WDT 7[3] determines, based on the clock signals CLK[3] and CLK[2], the presence or absence of a fault in the CLK[3] (or the presence or absence of a fault in the frequency divider 6[3]), and generates and outputs a clock error determination signal CE[3] indicating the result of the determination.

The frequency divider 6[3] and the WDT 7[3] can be regarded as having the same configuration and operating in the same way as the frequency divider $6_A$ and the WDT $7_A$ in FIG. 7. In that case, the signals CLK[3], $S_{RSTN}$[3], CLK[2], $S_{RSTN}$[2], CLR[3], and CE[3] in FIG. 9 can be regarded as the signals $CLK_A$, $S_{RSTNA}$, $CLK_B$, $S_{RSTNB}$, $CLR_A$, and $CE_A$, respectively, in FIG. 7.

The digital processing device of the third practical example further includes an error handling circuit 8. The error handling circuit 8 is fed with the clock signals CLK[1] to CLK[3], the synchronous reset signals $S_{RSTN}$[1] to $S_{RSTN}$[3], the reset signal $E_{RST}$[1] to $E_{RST}$[3] for the error handling circuit, and a bunch of error determination signals. The bunch of error determination signals includes reset cancellation error determination signals Erra[1] to Erra[3], reset issuance error determination signals Errb[1] to Errb[3], and clock error determination signals CE[1] to CE[3].

Figure 11:
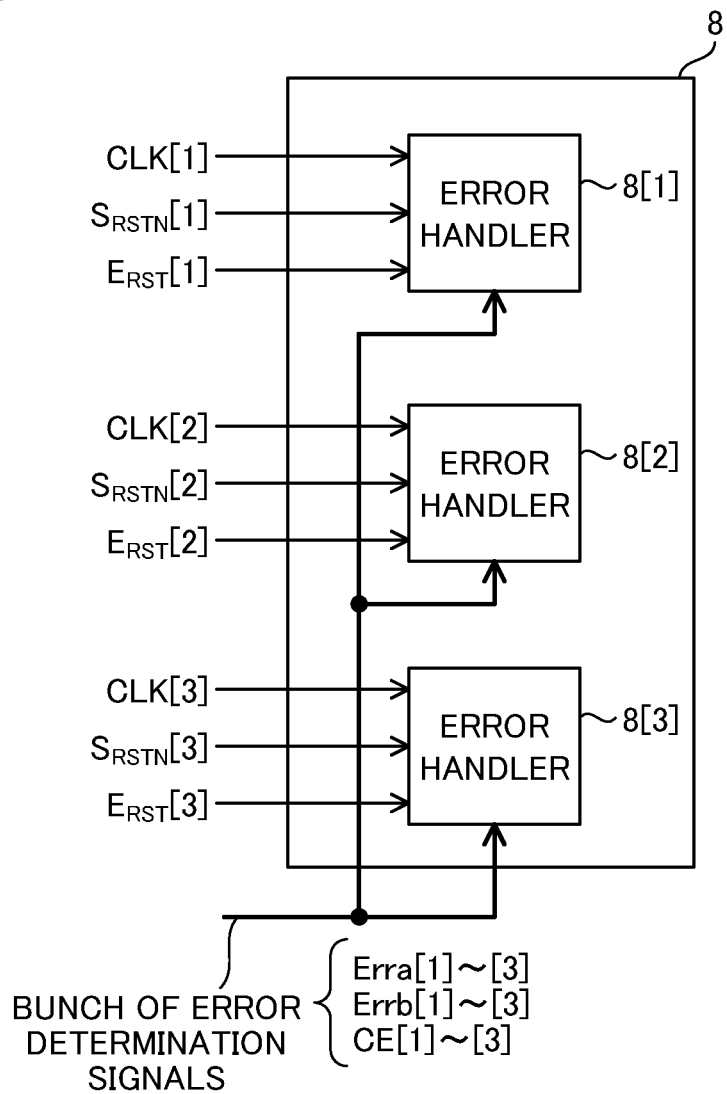
FIG. 11 is an internal configuration diagram of the error handling circuit in FIG. 9.
Figure 12:
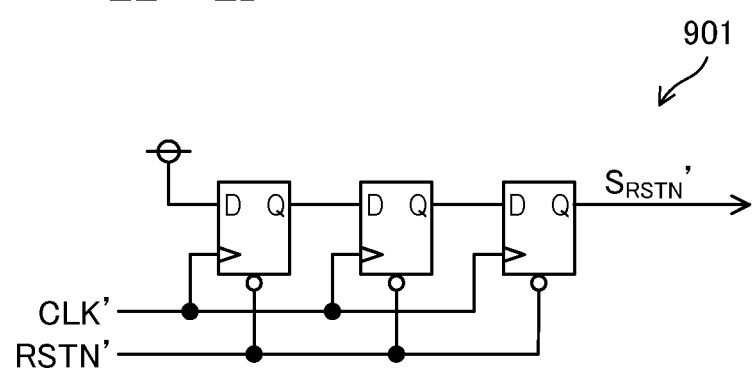
FIG. 12 is a configuration diagram of a known synchronous reset signal generation circuit.

The error handling circuit 8 shown in FIG. 11 includes error handlers 8[1] to 8[3]. The input signals to and the operation of the error handler 8[i], which can be any of the error handlers 8[1] to 8[3], will now be described. The error handler 8[$i$] is fed with the clock signal CLK[i], the synchronous reset signal $S_{RSTN}$[i], and the reset signal $E_{RST}$[i]. The error handler 8[$i$] is a circuit that operates in synchronization with the clock signal CLK[i], and includes a flip-flop or the like that operates in synchronization with the clock signal CLK[i].

The error handler 8[$i$] is fed also with the bunch of error determination signals. Based on the bunch of error determination signals, the error handler 8[$i$] performs predetermined error handling. When the signal level of any one or more of the error determination signals among the bunch of error determination signals is high (i.e., when the signal level of any one or more of the signals Erra[1] to Erra[3], Errb[1] to Errb[3], and CE[1] to CE[3] is high), the error handler 8[$i$] performs predetermined operation for coping with error occurrence as error handling.

When the synchronous reset signal $S_{RSTN}$[i] is at low level, the error handler 8[$i$] is in a reset state and in principle do not perform error handling. However, to allow the error handler 8[$i$] to function effectively on occurrence of a reset error related to the synchronous reset signal $S_{RSTN}$[i], the error handler 8[$i$] is fed with the reset signal $E_{RST}$[i] so that, when the reset signal $E_{RST}$[i] is at high level, irrespective of the synchronous reset signal $S_{RSTN}$[i], the error handler 8[$i$] is released from a reset state to perform error handling.

In the operation for coping with error occurrence, "1" is substituted in an error flag that has "0" substituted in it in principle. With "1" substituted in the error flag, the error handling circuit 8 transmits a predetermined error occurrence indication signal to a host system circuit (not illustrated) that is connected to the digital processing device in FIG. 9. On receiving the error occurrence indication signal, the host system circuit performs necessary protection operation such as to stop the operation of the equipment that incorporates the digital processing device in FIG. 9.

In the operation for coping with error occurrence, such operation may be performed as permits discriminating what error has occurred. In most specific terms, for example, the error handling circuit 8 can be provided with a first to a ninth error flag that are associated one to one to the signals Erra[1] to Erra[3], Errb[1] to Errb[3], and CE[1] to CE[3], each error flag having "0" as its initial value. When any of the signals Erra[1] to Erra[3], Errb[1] to Errb[3], and CE[1] to CE[3] turns to high level, the error handling circuit 8 can substitute "1" only in the error flag associated with that signal which has turned to high level among the nine signals. Here, the error occurrence indication signal may contain information on which of the first to ninth error flags "1" is substituted in.

The error flags are allocated in a memory (not illustrated) provided in the error handling circuit 8. The memory where the error flags are allocated may be a nonvolatile memory such as an EEPROM (electrically erasable programmable read-only memory) or a volatile memory.

With the configuration in FIG. 9, both a reset error and a clock error can be detected for each clock signal, and it is thus possible to build a system (a system including a digital processing device) with high reliability.

As will be understood from the above description, the clock signals CLK[1] and CLK[2] are clock signals that chiefly enable the logic circuits LGa and LGb to operate. In contrast, the clock signal CLK[3] serves as a safety mechanism-dedicated clock signal CLKSM for detecting a clock error related to the clock signals CLK[1] and CLK[2].

Fourth Practical Example

A fourth practical example of the present disclosure will be described. With the configuration of the first practical example (see FIG. 6), it is possible only to detect a fault in which the signals E1 and E2 are at high level and in addition the signal $S_{RSTN}$ is at low level and a fault in which the signals E1 and E2 are at low level and in addition the signal $S_{RSTN}$ is at high level (a similar description applies to the third practical example). This can be said to be enough where the purpose is to detect a fault in the synchronous reset signal $S_{RSTN}$ itself. Even so, a digital processing device may be so configured as to be able to detect other types of faults as well.

For example, in the configuration in FIG. 6, consider a fault in which the output circuits 2 and 4 are normal but the signal E1 is fixed at low level. This (i.e., a fault in the output circuit 3) can be detected by adding to the fault determination circuit 5 an AND circuit (not illustrated) that outputs a high-level signal when the signals $S_{RSTN}$ and E2 are at high level and in addition the signal E1 is at low level and transmitting that high-level signal, as a signal indicating a fault in the circuit 1 to the error handling circuit 8 (see FIG. 9).

For another example, in the configuration in FIG. 6, consider a fault in which the output circuits 2 and 3 are normal but the signal E2 is fixed at high level. This (i.e., a fault in the output circuit 4) can be detected by adding to the fault determination circuit 5 an AND circuit (not illustrated) that outputs a high-level signal when the signals $S_{RSTN}$ and E1 are at low level and in addition the signal E2 is at high level and transmitting that high-level signal, as a signal indicating a fault in the circuit 1 to the error handling circuit 8 (see FIG. 9).

In the configuration in FIG. 9, the function of the fault determination circuit 5 in the synchronous reset signal generation circuits 1[1] to 1[3] may be assumed by the error handling circuit 8. Specifically (see also FIG. 6), the synchronous reset signal $S_{RSTN}$ ($S_{RSTN}$[1]) and the error determination signals E1 and E2 generated by the synchronous reset signal generation circuit 1[1], the synchronous reset signal $S_{RSTN}$ ($S_{RSTN}$[2]) and the error determination signals E1 and E2 generated by the synchronous reset signal generation circuit 1[2], and the synchronous reset signal $S_{RSTN}$ ($S_{RSTN}$[3]) and the error determination signals E1 and E2 generated by the synchronous reset signal generation circuit 1[3] may be transmitted to the error handling circuit 8 so that the error handling circuit 8 assumes the function of the fault determination circuit 5 in the synchronous reset signal generation circuits 1[1] to 1[3]. In that case, the output circuits 2 to 4 and the error handling circuit 8 can be understood to constitute a synchronous reset signal generation circuit according to the present disclosure.

Fifth Practical Example

A fifth practical example of the present disclosure will be described. While in the third practical example it is assumed that two clock signals are used for logic circuits, three clock signals may be used for logic circuits. Specifically, for example, in the digital processing device of the third practical example (see FIG. 9), there may be provided, in addition to the logic circuit that operates in synchronization with the clock signal CLK[1] and the logic circuit that operates in synchronization with the clock signal CLK[2], a logic circuit that operates in synchronization with a clock signal CLK[4]. In that case, the digital processing device in FIG. 9 can additionally include, for the clock signal CLK[4], a synchronous reset signal generation circuit 1[4], a frequency divider 6[4], and a WDT 7[4] (of which none is illustrated), and the signals Erra[4] and Errb[4] from the generation circuit 1[4] and the signal CE[4] from the WDT 7[4] can be added to the bunch of error determination signals. Similar modifications are possible in configurations where four or more clock signals are used for logic circuits.

Sixth Practical Example

A sixth practical example of the present disclosure will be described. One clock signal may be used for logic circuits. In that case, from the digital processing device of the third practical example (see FIGS. 9 to 11), the circuit block associated with the clock signal CLK[1] (including the synchronous reset signal generation circuit 1[1], the frequency divider 6[1], the WDT 7[1], the logic circuit LG[1], and the error handler 8[1]) can be omitted.

Seventh Practical Example

A seventh practical example of the present disclosure will be described. The digital processing device of the third practical example (see FIGS. 9 to 11) may be modified so as not to use the clock signal CLK[3] corresponding to a safety mechanism-dedicated clock signal CLKSM. In that case, from the digital processing device of the third practical example (see FIGS. 9 to 11), the circuit block associated with the clock signal CLK[3] (including the synchronous reset signal generation circuit 1[3], the frequency divider 6[3], the WDT 7[3], and the error handler 8[3]) can be omitted, and the clock signals CLK[1] and CLK[2], the frequency dividers 6[1] and 6[2], and the WDTs 7[1] and 7[2] in FIG. 9 can be regarded as the clock signals $CLK_A$ and $CLK_B$, the frequency dividers $6_A$ and $6_B$, and WDTs $7_A$ and $7_B$ so as to achieve mutual monitoring of the clock signals CLK[1] and CLK[2].

Eighth Practical Example

An eighth practical example of the present disclosure will be described. A synchronous reset signal generation circuit and a digital processing device according to the embodiment can be incorporated in any equipment that needs to operate in synchronization with a clock signal, and such equipment can be equipment in which high reliability is desired. For example, a synchronous reset signal generation circuit and a digital processing device according to the embodiment can be incorporated in or connected to an ECU (electronic control unit) provided in the body of a vehicle, or may be incorporated in industrial equipment or equipment for controlling atomic reactors, or may be incorporated in equipment for controlling train operation on railroads.

Ninth Practical Example

A ninth practical example of the present disclosure will be described.

In the above description, each FF is assumed to be a positive-edge-triggered FF; instead each FF may be a negative-edge-triggered FF.

For any of the signals discussed above, the relationship between high level and low level may be reversed. In this connection, for any of the signals discussed above, positive or negative logic may be adopted as necessary.

A semiconductor device can be configured to include solely a digital processing device according to the embodiment, or a semiconductor device can be configured to include a digital processing device according to the embodiment along with another device (such as a processor or a memory). Here a semiconductor device is a device built by sealing a semiconductor integrated circuit in a package, and the semiconductor integrated circuit constitutes a digital processing device according to the embodiment, along with the other device as necessary.

Embodiments of the present disclosure can be modified in many ways as necessary without departure from the scope of the technical concepts defined in the appended claims. The embodiments described herein are merely examples of how the present disclosure can be implemented, and what is meant by any of the terms used to describe the present disclosure and its constituent elements is not limited to that mentioned in connection with the embodiments. The specific values mentioned in the above description are merely exemplary and needless to say can be modified to different values.

REFERENCE SIGNS LIST

1, $1_A$, $1_B$, 1[i] synchronous reset signal generation circuit
2 synchronous reset signal output circuit
3 first error determination signal output circuit
4 second error determination signal output circuit
5 fault determination circuit
$6_A$, $6_B$, 6[i] frequency divider
$7_A$, $7_B$, 7[i] watch dog timer
8 error handling circuit
LG, LGa, LGb logic circuit
CLK, $CLK_A$, $CLK_B$, CLK[i] clock signal
RSTN asynchronous reset signal
$S_{RSTN}$, $S_{RSTNA}$, $S_{RSTNB}$, $S_{RSTN}$[i] synchronous reset signal
E1 first error determination signal
E2 second error determination signal

The invention claimed is:
1. A synchronous reset signal generation circuit configured to generate a synchronous reset signal by synchronizing an asynchronous reset signal with a clock signal, the synchronous reset signal generation circuit comprising:
a synchronous reset signal output circuit
having L flip-flops connected in a cascade arrangement and
configured to output the synchronous reset signal from a final-stage flip-flop among the L flip-flops;
a first error determination signal output circuit
having M flip-flops connected in a cascade arrangement and
configured to output a first error determination signal from a final-stage flip-flop among the M flip-flops;
a second error determination signal output circuit
having N flip-flops connected in a cascade arrangement and
configured to output a second error determination signal from a final-stage flip-flop among the N flip-flops; and
a fault determination circuit configured to determine presence or absence of a fault in the synchronous reset signal generation circuit based on the synchronous reset signal, the first error determination signal, and the second error determination signal,
wherein
the first error determination signal is input to an initial-stage flip-flop among the N flip-flops,
the clock signal and the asynchronous reset signal are commonly input to the L, M, and N flip-flops, and
L, M, and N are integers fulfilling M≥2, L≥M+1, and M+N≥L+1 simultaneously.

2. The synchronous reset signal generation circuit according to claim 1, wherein
L≥M+2 and M+N≥L+2 are fulfilled simultaneously.

3. The synchronous reset signal generation circuit according to claim 1, wherein
each flip-flop in the synchronous reset signal output circuit, the first error determination signal output circuit, and the second error determination signal output circuit has a data input terminal, a data output terminal, a clock input terminal, and an asynchronous reset input terminal, wherein the clock signal is input to the clock input terminal of each flip-flop, the asynchronous reset signal is input to the asynchronous reset input terminal of each flip-flop, and between two mutually adjacent flip-flops, an output signal from the data output terminal of a former-stage flip-flop is input to the data input terminal of a latter-stage flip-flop,
among the L flip-flops, a signal with a predetermined logic value is input to the data input terminal of an initial-stage flip-flop, and the synchronous reset signal is output from the data output terminal of the final-stage flip-flop,
among the M flip-flops, the signal with the predetermined logic value is input to the data input terminal of an initial-stage flip-flop, and the first error determination signal is output from the data output terminal of the final-stage flip-flop, and
among the N flip-flops, the first error determination signal is input to the data input terminal of the initial-stage flip-flop, and the second error determination signal is output from the data output terminal of the final-stage flip-flop.

4. The synchronous reset signal generation circuit according to claim 3,
wherein each flip-flop, when the asynchronous reset signal in an active state is input thereto, outputs from the data output terminal a signal with a first logic value and each flip-flop, when the asynchronous reset signal in a non-active state is input thereto, holds a logic value of an input signal to the data input terminal in response to a predetermined level change in the clock signal and outputs from the data output terminal a signal with the held logic value,
the predetermined logic value is a second logic value, and
the synchronous reset signal with the first logic value is a signal for resetting a logic circuit configured to operate in synchronization with the clock signal.

5. The synchronous reset signal generation circuit according to claim 4,
wherein the fault determination circuit determines presence of the fault when the first and second error determination signals have the second logic value and in addition the synchronous reset signal has the first logic value.

6. The synchronous reset signal generation circuit according to claim 4, wherein
the fault determination circuit determines presence of the fault when the first and second error determination signals have the first logic value and in addition the synchronous reset signal has the second logic value.

7. A digital processing device comprising:
the synchronous reset signal generation circuit according to claim 1; and a clock fault determination circuit,
wherein the clock fault determination circuit determines presence or absence of a fault in the clock signal based on the clock signal and another clock signal different from the clock signal.

8. The digital processing device according to claim 7,
wherein the clock fault determination circuit includes:
a frequency divider configured to generate a frequency-divided clock signal by dividing a frequency of the clock signal; and
a monitoring circuit configured to monitor, using the another clock signal, intervals of predetermined level changes in the frequency-divided clock signal,
the clock fault determination circuit being configured to determine, based on a result of the monitoring, presence or absence of the fault in the clock signal or a fault in the frequency divider.

9. The digital processing device according to claim 8,
wherein the frequency divider is composed of a plurality of stages of frequency-division flip-flops each having a data input terminal, a data output terminal, and a clock input terminal,
in each frequency-division flip-flop, a logically inverted signal of an output signal from the data output terminal becomes an input signal to the data input terminal, and among the plurality of stages of frequency-division flip-flops,
the clock signal is input to the clock input terminal of an initial-stage frequency-division flip-flop,
to the clock input terminal of each frequency-division flip-flop except the initial-stage frequency-division flip-flop, an output signal from the data output terminal of a frequency-division flip-flop in a preceding stage is input, and
the frequency-divided clock signal is output from the data output terminal of a final-stage frequency-division flip-flop.

10. A digital processing device comprising:
a plurality of synchronous reset signal generation circuits including a first and a second synchronous reset signal generation circuit; and
a plurality of clock fault determination circuits including a first and a second clock fault determination circuit, wherein
the synchronous reset signal generation circuit according to claim 1 is used as each of the first and second synchronous reset signal generation circuits,
the clock signal in the first synchronous reset signal generation circuit and the clock signal in the second synchronous reset signal generation circuit are a first clock signal and a second clock signal respectively,
the first clock fault determination circuit is configured to determine presence or absence of a fault in the first clock signal based on the first and second clock signals, and
the second clock fault determination circuit is configured to determine presence or absence of a fault in the second clock signal based on the second and first clock signals.

11. The digital processing device according to claim 10, wherein
the first clock fault determination circuit includes:
a first frequency divider configured to generate a first frequency-divided clock signal by dividing a frequency of the first clock signal; and
a first monitoring circuit configured to monitor, using the second clock signal, intervals of predetermined level changes in the first frequency-divided clock signal,
the first clock fault determination circuit being configured to determine, based on a result of the monitoring, presence or absence of the fault in the first clock signal or a fault in the first frequency divider, and the second clock fault determination circuit includes:
- a second frequency divider configured to generate a second frequency-divided clock signal by dividing a frequency of the second clock signal; and
- a second monitoring circuit configured to monitor, using the first clock signal, intervals of predetermined level changes in the second frequency-divided clock signal,
- the second clock fault determination circuit being configured to determine, based on a result of the monitoring, presence or absence of the fault in the second clock signal or a fault in the second frequency divider.

12. The digital processing device according to claim 11, wherein the first and second frequency dividers are each composed of a plurality of stages of frequency-division flip-flops each having a data input terminal, a data output terminal, and a clock input terminal, in each frequency-division flip-flop in each frequency divider, a logically inverted signal of an output signal from the data output terminal becomes an input signal to the data input terminal, and among the plurality of stages of frequency-division flip-flops in the first frequency divider, the first clock signal is input to the clock input terminal of an initial-stage frequency-division flip-flop, to the clock input terminal of each frequency-division flip-flop except the initial-stage frequency-division flip-flop, an output signal from the data output terminal of a frequency-division flip-flop in a preceding stage is input, and the first frequency-divided clock signal is output from the data output terminal of a final-stage frequency-division flip-flop in the first frequency divider, and among the plurality of stages of frequency-division flip-flops in the second frequency divider, the second clock signal is input to the clock input terminal of an initial-stage frequency-division flip-flop, to the clock input terminal of each frequency-division flip-flop except the initial-stage frequency-division flip-flop, an output signal from the data output terminal of a frequency-division flip-flop in a preceding stage is input, and the second frequency-divided clock signal is output from the data output terminal of a final-stage frequency-division flip-flop in the second frequency divider.

* * * * *